US010145921B2

(12) United States Patent
Campagna

(10) Patent No.: US 10,145,921 B2
(45) Date of Patent: Dec. 4, 2018

(54) METHOD AND APPARATUS FOR AUTOMATED DETERMINATION OF THE RESONANCE FREQUENCIES OF PROTONS FOR MAGNETIC RESONANCE EXAMINATIONS

(71) Applicant: Siemens Aktiengesellschaft, Munich (DE)

(72) Inventor: Swen Campagna, Engelthal (DE)

(73) Assignee: Siemens Aktiengesellschaft, Munich (DE)

( * ) Notice: Subject to any disclaimer, the term of this patent is extended or adjusted under 35 U.S.C. 154(b) by 966 days.

(21) Appl. No.: 14/622,135

(22) Filed: Feb. 13, 2015

(65) Prior Publication Data

US 2015/0226822 A1 Aug. 13, 2015

(30) Foreign Application Priority Data

Feb. 13, 2014 (DE) .................. 10 2014 202 604

(51) Int. Cl.
*G01R 33/56* (2006.01)
*G01R 33/48* (2006.01)
*G01R 33/54* (2006.01)
*G01R 33/565* (2006.01)
*G01R 33/58* (2006.01)
G01R 33/46 (2006.01)

(52) U.S. Cl.
CPC ..... *G01R 33/5608* (2013.01); *G01R 33/4828* (2013.01); *G01R 33/543* (2013.01); *G01R 33/546* (2013.01); *G01R 33/56509* (2013.01); *G01R 33/583* (2013.01); *G01R 33/46* (2013.01)

(58) Field of Classification Search
CPC ........... G01R 33/5608; G01R 33/4835; G01R 33/5611; G01R 33/543
USPC ........................................................ 324/309
See application file for complete search history.

(56) References Cited

U.S. PATENT DOCUMENTS

| 4,857,844 A * | 8/1989 | Van Vaals .......... G01R 33/4625 324/307 |
| 5,912,558 A | 6/1999 | Halamek et al. |
| 7,395,108 B2 * | 7/2008 | Roopchansingh .......................... G01R 33/56563 324/307 |
| 7,420,368 B2 * | 9/2008 | Miyazaki .......... G01R 33/4828 324/307 |

(Continued)

OTHER PUBLICATIONS

Nguyen, Hien Minh. Towards high-resolution magnetic resonance spectroscopic imaging: Spatiotemporal denoising and echo-time selection. University of Illinois at Urbana-Champaign, 2011.*

(Continued)

*Primary Examiner* — Christopher McAndrew
(74) *Attorney, Agent, or Firm* — Schiff Hardin LLP

(57) ABSTRACT

In a method and magnetic resonance system for the automated determination of the resonance frequency or resonance frequencies of protons for magnetic resonance examinations, at least one signal is acquired and Fourier transform to a spectrum. An automated analysis of the spectrum, that has three resonance peaks, is made with at least two cross-correlation coefficients of at least one model spectrum being determined with the measured spectrum. Depending on the values of the cross-correlation coefficients, the resonance frequency is or resonance frequencies are determined.

14 Claims, 7 Drawing Sheets

(56) References Cited

U.S. PATENT DOCUMENTS

| | | | | |
|---|---|---|---|---|
| 8,034,634 B2* | 10/2011 | Hong | G01N 27/74 | 436/518 |
| 8,362,771 B2* | 1/2013 | Dornhaus | G01R 33/243 | 324/309 |
| 8,421,459 B2* | 4/2013 | Koch | G01R 33/243 | 324/300 |
| 8,447,089 B2* | 5/2013 | Liu | A61B 5/055 | 324/309 |
| 8,710,840 B2* | 4/2014 | Gross | G01R 33/565 | 324/309 |
| 8,712,499 B2* | 4/2014 | Subramanian | G01N 24/08 | 600/407 |
| 8,754,645 B2* | 6/2014 | Gross | G01R 33/50 | 324/307 |
| 8,854,038 B2* | 10/2014 | Hernando | G01R 33/56563 | 324/307 |
| 8,957,681 B2* | 2/2015 | Hernando | G01R 33/4828 | 324/309 |
| 9,213,076 B2* | 12/2015 | Liu | G01R 33/56545 | |
| 9,250,307 B2* | 2/2016 | Huwer | G01R 33/56341 | |
| 9,345,421 B2* | 5/2016 | Peacock, III | G01R 33/4625 | |
| 9,664,761 B2* | 5/2017 | Liu | A61B 5/055 | |
| 9,766,316 B2* | 9/2017 | Sato | G01R 33/5608 | |
| 2003/0003053 A1* | 1/2003 | Uetake | G01R 33/4828 | 424/9.3 |
| 2003/0210046 A1* | 11/2003 | Wind | G01R 33/307 | 324/307 |
| 2006/0241382 A1* | 10/2006 | Li | A61B 5/055 | 600/410 |
| 2007/0229070 A1* | 10/2007 | Miyazaki | G01N 24/08 | 324/307 |
| 2008/0231271 A1* | 9/2008 | Yui | G01R 33/5614 | 324/307 |
| 2009/0108843 A1* | 4/2009 | Koch | G01R 33/5616 | 324/309 |
| 2010/0085050 A1* | 4/2010 | Dong | G01R 33/243 | 324/309 |
| 2011/0050223 A1* | 3/2011 | Balcom | G01R 33/305 | 324/307 |
| 2011/0103670 A1* | 5/2011 | Koch | G01R 33/243 | 382/131 |
| 2011/0109309 A1* | 5/2011 | Levy | G01R 33/4804 | 324/309 |
| 2011/0234221 A1* | 9/2011 | Feiweier | G01R 33/56518 | 324/307 |
| 2012/0049846 A1* | 3/2012 | Gross | G01R 33/565 | 324/309 |
| 2012/0068703 A1* | 3/2012 | Gross | G01R 33/50 | 324/309 |
| 2012/0245453 A1* | 9/2012 | Tryggestad | A61B 6/463 | 600/413 |
| 2012/0268121 A1* | 10/2012 | Hernando | G01R 33/50 | 324/309 |
| 2013/0088231 A1* | 4/2013 | Oliveira | G01R 33/583 | 324/314 |
| 2013/0119984 A1* | 5/2013 | Levy | G01R 33/4804 | 324/309 |
| 2013/0214781 A1* | 8/2013 | Hernando | G01R 33/4828 | 324/309 |
| 2013/0265046 A1* | 10/2013 | Koch | G01R 33/56536 | 324/309 |
| 2014/0028314 A1* | 1/2014 | Paul | G01R 33/387 | 324/309 |

OTHER PUBLICATIONS

Noll, Douglas C., and Walter Schneider. "Theory, simulation, and compensation of physiological motion artifacts in functional MRI." Image Processing, 1994. Proceedings. ICIP-94., IEEE International Conference. vol. 3. IEEE, 1994.*

Biswal, Bharat, et al. "Functional connectivity in the motor cortex of resting human brain using echo-planar MRI." Magnetic resonance in medicine 34.4 (1995): 537-541.*

Nguyen, Hien M. Towards high-resolution magnetic resonance spectroscopic imaging: spatiotemporal denoising and echo-time selection. Diss. University of Illinois at Urbana-Champaign, 2012.*

Gorczyca, D. P., et al. "Silicone breast implant rupture: comparison between three-point Dixon and fast spin-echo MR imaging." AJR. American journal of roentgenology 162.2 (1994): 305-310.*

Provencher, Stephen W. "Automatic quantitation of localized in vivo 1H spectra with LCModel." NMR in Biomedicine 14.4 (2001): 260-264.*

MacKinnon et al. "Variable Reference Alignment: An Improved Peak Alignment Protocol for NMR Spectral Data with Large Intersample Variation"; Analytical Chemistry; vol. 84; pp. 5372-5379; (2012).

Savorani et al. "icoshift: A versatile tool for the rapid alignment of 1D NMR spectra"; Journal of Magnetic Resonance; vol. 202; pp. 190-202; (2010).

Wong et al. "Application of Fast Fourier Transform Cross-Correlation for the Alignment of Large Chromatographic and Spectral Datasets"; Analytical Chemistry; vol. 77; No. 17; pp. 5655-5661; (2005).

Vu et al. "Getting Your Peaks in Line: A Review of Alignment Methods for NMR Spectral Data"; Metabolites; vol. 3; pp. 259-276; ISSN: (2013).

Van Huffel et al: "Automatic Frequency alignment and quantitation of single resonances in multiple magnetic resonance spectra via complex principal component analysis"; Journal of Magnetic Resonance, vol. 158 (2002) pp. 1-14 (2002).

* cited by examiner

METHOD AND APPARATUS FOR AUTOMATED DETERMINATION OF THE RESONANCE FREQUENCIES OF PROTONS FOR MAGNETIC RESONANCE EXAMINATIONS

BACKGROUND OF THE INVENTION

Field of the Invention

The present invention concerns a method and an apparatus for automated determination of the resonance frequencies of protons for magnetic resonance examinations.

Description of the Prior Art

The resonance frequency of atomic nuclei in an external magnetic field depends on the strength of the field. It can be calculated using the Larmor equation:

$$\omega = \gamma * B_0.$$

For hydrogen nuclei, i.e. protons, it is approximately 63.5 MHz at 1.5 T.

Where atomic nuclei of a chemical element are present in different environments, the resonance frequency also varies due to the "chemical shift effect":

$$S = (\nu_{SS} - \nu_{Ref})/\nu_{Ref}.$$

This is given in ppm and thus independently of the field strength $B_0$ of the magnetic field.

The resonance frequency of fat protons has a spacing from that of water protons of 3.5 ppm, and silicone protons have a spacing of 5.0 ppm. At a field strength of 1.5 T, these represent spacings of 225 Hz and 320 Hz. The nuclei which can thus be distinguished are also known as "spin species". Accordingly, $\square_{SS}$ denotes the frequency of the spin species.

Before the imaging or spectroscopic magnetic resonance experiments are performed, various adjustment measurements are carried out. Among other things, the currents of the shim coils are set automatically and the resonance frequency of protons is also determined automatically in order to adjust the transmission frequency of the radio-frequency coils.

In order to determine the resonance frequency, a user is asked whether silicone is present in the test object. A spectrum is also recorded. Based on this information, model spectra with two resonance peaks are selected, and a calculation of cross-correlation coefficients of the model spectra and of the recorded spectrum are determined. The cross-correlation coefficient with the highest numerical value indicates the best match. In this way, the resonance frequencies of the spin species present in the test object can be determined.

In this spectrum, each spin species essentially has one peak. Although the spin species attributed to fat due to the chemical characteristics have a plurality of peaks, one of these is dominant. Where "a" fat peak or resonance signal is referred to below, this does not preclude the presence of other peaks. It merely means that only one peak is relevant for the method according to the invention.

However, this method is error-prone such that the enquiry to the user cannot be one-hundred percent error-free. Firstly, the user may simply make a typographical error and so input faulty information. Secondly, the user may also make a mistake if he or she is unaware of the presence of a silicone implant. In addition, it is usual to store this information with a measuring protocol. In this case, the user must explicitly remember to change the value.

SUMMARY OF THE INVENTION

An object of the present invention is to provide a method for determining a resonance frequency that is less error-prone.

A basis of the invention is that the model functions used for determining a resonance frequency always have three resonance peaks. Although the method has the intrinsic disadvantage that given the lack of one, or even two spin species, the cross-correlation coefficients can only reach a particular and purely numerically low value. However, this is not important since there is always a cross-correlation coefficient with the highest numerical value, based on which the resonance frequency or resonance frequencies can be determined.

If, for any reason, it is still unclear exactly which of the spin species is producing a signal, for example, respective correlation coefficients of parts of the spectrum and of the model spectrum can be calculated. If the correlation coefficient exceeds a pre-determined numerical value, the spin species or the corresponding resonance peak is taken to be present.

The method according to the invention is naturally carried out with all the steps on one or more control devices.

Preferably, the frequency spacings of the resonance peaks can correspond to the frequency spacings of water protons from fat protons and water protons from silicone protons. These may be frequency spacings from the literature or the most recently determined frequency spacings. These spacings are used since these are the most frequently occurring resonance peaks in investigations on patients.

Advantageously, a number of model spectra can be used in which the frequency spacing of the resonance peaks is varied. Instead of 3.5 ppm and 5 ppm, purely as an example, the following pairs of frequency spacings can be used:

| Water - fat | Water - silicone |
|---|---|
| 3.4 | 4.9 |
| 3.5 | 4.9 |
| 3.6 | 4.9 |
| 3.4 | 5.0 |
| 3.5 | 5.0 |
| 3.6 | 5.0 |
| 3.4 | 5.1 |
| 3.5 | 5.1 |
| 3.6 | 5.1 |

As can be seen, even with a slight variation in the respective frequency spacings, there are nine model spectra. If only the frequency spacings with a relatively large bandwidth and relatively small step widths are varied, hundreds of model spectra for which cross-correlation coefficients are to be calculated can easily be obtained. However, with the available computing power, this is not problematic.

Preferably, all, i.e. in this case both, of the frequency spacings of the resonance peaks can be increased or reduced in each case. To remain with the above example, this means that all variants in which one spacing is reduced and the other is increased or remains the same are not taken into account. This results in a list with the following entries:

| Water - fat | Water - silicone |
|---|---|
| 3.4 | 4.9 |
| 3.5 | 5.0 |
| 3.6 | 5.1 |

The calculation effort can thus be reduced to a fraction by simple means.

Preferably, a number of model spectra can be used in which the relative signal intensities of the resonance peaks are varied. The relative signal intensities of the resonance peaks depend, inter alia, on the region under investigation. They can also depend on the test object. Adipose patients have a much greater signal intensity from fat relative to the signal intensity of the water. The fat distribution and the water distribution in the body are also not constant. The relative signal intensity of silicone depends on the size of the implant.

However, an adaptation can be carried out in that the maximum intensity of the measured spectrum is also used as the maximum intensity of the at least one model spectrum. Alternatively, the signal intensities of all the model spectra can have a pre-determined maximum value wherein, naturally, the relative signal intensities continue to change. The measured spectrum is then scaled to this maximum value by calculating a scaling factor from the ratio of the pre-determined maximum value and the maximum value of the measured spectrum, and the overall spectrum is multiplied by this scaling factor. By this means, the cross-correlation coefficients are maximized without their ratio to one another being changed.

Preferably, a number of model spectra can be used in which the line widths of the resonance peaks are varied. The worse the shim is, the wider are the resonance peaks. In general, therefore, the line widths of the resonance peaks widen proportionally. The variation of the line widths therefore also maximizes the cross-correlation coefficients without changing them in relation to one another.

Advantageously, the calculation of the cross-correlation coefficients can be terminated if a pre-determined threshold value is exceeded. As described, hundreds of model spectra can be used. However if, before the calculation of all the cross-correlation coefficients, a value is already produced which indicates that a model spectrum exists which either fits perfectly to the measured spectrum, i.e. that the cross-correlation coefficient is high or that, proceeding from this model spectrum, only slight improvements can be achieved which no longer noticeably improve the quality of the determination of the resonance frequencies, then the analysis can also be terminated relatively early, i.e. following analysis of a few spectra.

Preferably, a number of model spectra can be used, the parameters of which are varied in larger steps than is needed for a pre-determined quality. Although the deviations of the frequency differences of water protons and fat protons or water protons and silicone protons are each only within a narrow band, these differences are sufficient to cause an automatic determination of the resonance frequency to fail. For this reason, in the variation of the step widths, step widths of approximately 0.05 ppm are required. Since not only the frequency spacing, but also other parameters such as the relative signal intensities are adjusted, it is the rule that the first model spectra deviate relatively severely from the spectrum in at least one parameter. Therefore, the parameter space is initially scanned in rough steps to achieve pre-filtration. If, herein, the best model spectrum or one which barely deviates therefrom is already accidentally used, the determination of the resonance frequencies can be considered to be complete. If the cross-correlation coefficients obtained during this run-through are still all below the threshold value, the parameter space round the model spectrum which has resulted in the best correlation coefficients can first be searched. The analysis is continued until either all the model spectra have been analyzed or a cross-correlation coefficient above the threshold value has been obtained. Double analyses are prevented in that the previously used model spectra are marked as analyzed.

Preferably, one or more model spectra in which the signal intensities of the resonance peaks are essentially the same can be used as the first model spectrum or spectra. In the calculation of the cross-correlation coefficients, this leads thereto that in the measured spectrum, existing resonance peaks lead to the same values of the cross-correlation coefficients with the peaks of the model spectrum. By this means, a characteristic line generated from at least one part of the cross-correlation coefficient has characteristic peaks, from which it is possible to deduce the number of resonance peaks in the spectrum.

Preferably, the resonance frequency determined can be taken as the starting frequency for an additional execution of the method for adapting to movement artifacts. The resonance frequencies are dependent, as described in the introduction, on a large number of factors. For optimal adaptation of the transmission frequency, for each factor variation, a unique resonance frequency and thus transmission frequency is to be determined. For example, it may be necessary to determine the resonance frequency separately for the states "inhale" and "exhale". If the resonance frequency for the state "inhale" is determined, this frequency serves as the starting frequency for determining the resonance frequency of the state "exhale".

The aforementioned object also is achieved by a magnetic resonance system in accordance with the invention that has at least one radio-frequency coil for generating radio-frequency pulses, and a control device. The control device is designed to cause the magnetic resonance apparatus to implement the method as described above.

The implementation of the aforementioned method in the control device can take place as software or as (hard-wired) hardware.

Further advantageous embodiments of the method according to the invention correspond to suitable embodiments of the magnetic resonance system according to the invention.

DESCRIPTION OF THE PREFERRED EMBODIMENTS

Figure 1:
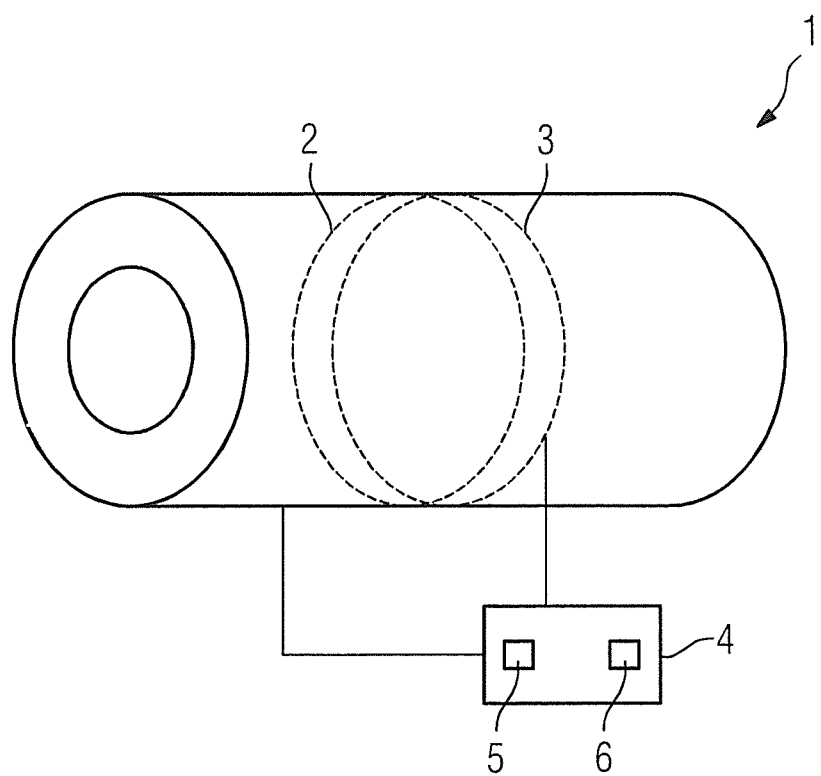
FIG. 1 schematically illustrates a magnetic resonance system.

FIG. 1 shows a magnetic resonance system 1 with two radio-frequency (RF) coils 2 and 3 and a control device 4. A shim adjustment unit 5 and a frequency adjustment unit 6 are provided in the control device 4. The shim adjustment unit 5 and the frequency adjustment unit 6 are components of the magnetic resonance system 1 for automated setting of operating parameters, specifically the shim currents and the transmission frequency. If the transmission frequency and the resonance frequency of the nuclei under investigation do not match, significant signal losses arise. The determination of the exact resonance frequency therefore serves for the setting of the transmission frequency, in this case, of the radio-frequency coil 2.

The radio-frequency coil 2 is an excitation coil and the radio-frequency coil 3 is a detection coil. The radio-frequency coil 3 is adapted to specific portions of the test object, for example as a "head coil", a "chest coil" or a "knee coil". The radio-frequency coil 2 is also designated a "body coil" and is less sensitive than the radio-frequency coil 3, but is homogeneous over a larger region. Since the radio-frequency coil 3 does not transmit, it also does not have to be adapted with respect to the resonance frequency of the nuclei under investigation. For clarity, further components of the magnetic resonance system 1 such as the patient support or the gradient coils are not shown.

The method described is implemented as software in the control device 4, more precisely, as frequency adjustment unit 6. Following positioning of the patient, it is carried out as part of the adjustment before the start of the examination measurements.

Figure 2:
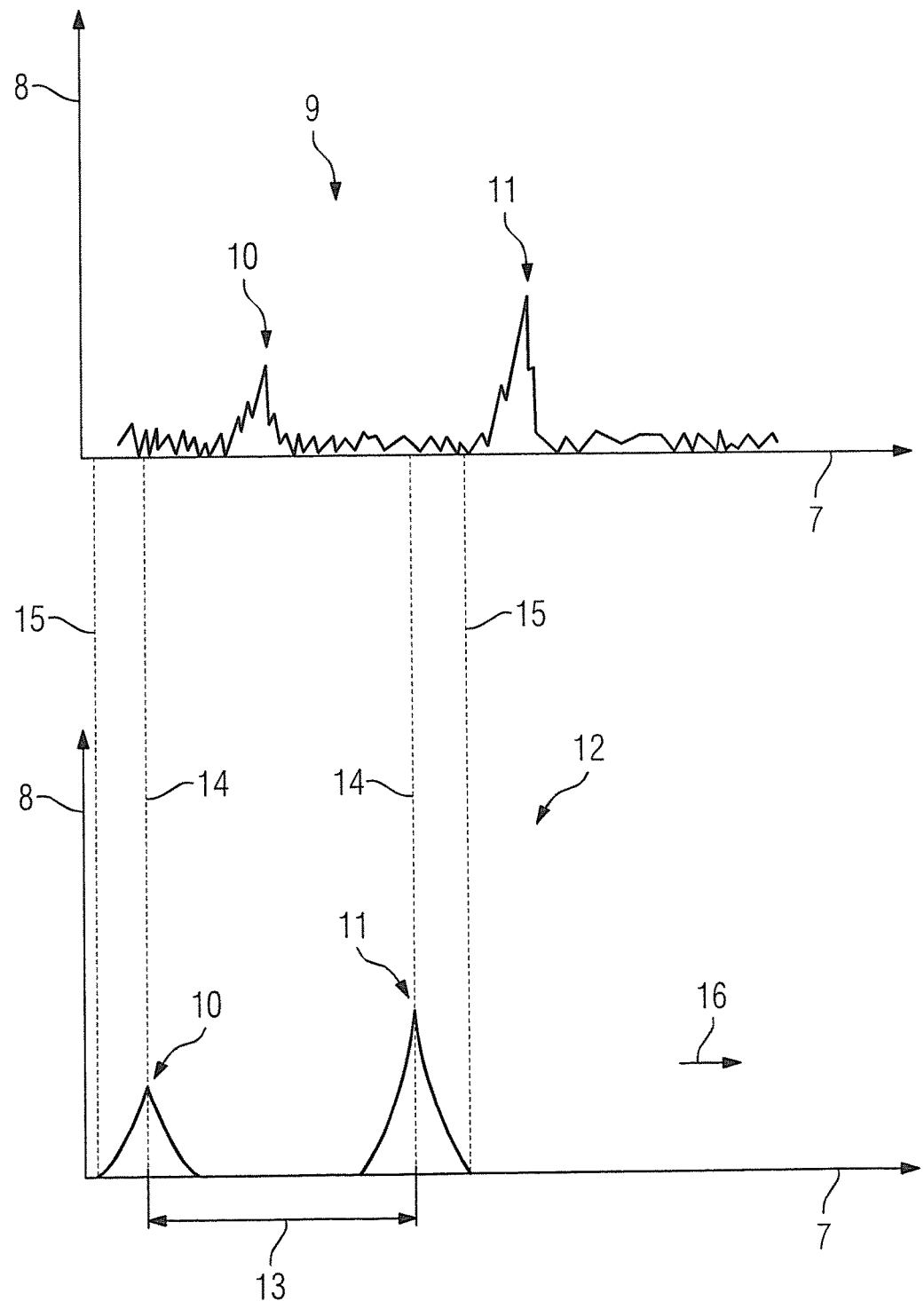
FIG. 2 shows a model spectrum in an embodiment according to the prior art.
Figure 3:
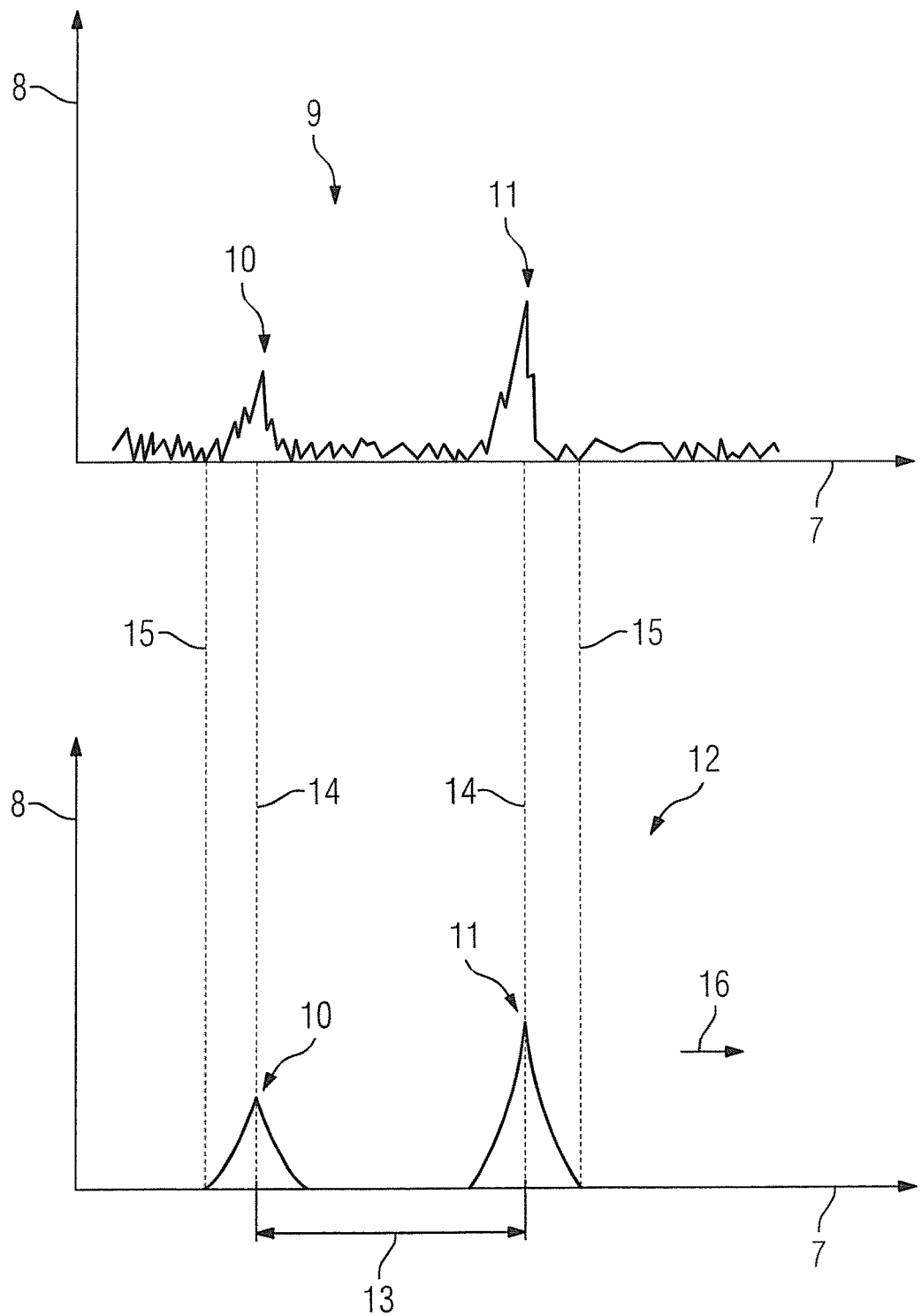
FIG. 3 shows a model spectrum in another embodiment according to the prior art.

FIGS. 2 and 3 show the procedure on determination of cross-correlation coefficients according to the prior art, once a user of the magnetic resonance system 1 has stated that fat and water are present in the test object. The axis 7 gives the value, in each case, of the frequency and the axis 8 is the signal intensity. Since the input of the user was correct, the measured spectrum 9 has a fat peak 10 and a water peak 11.

A model spectrum 12 with pre-determined relative signal intensities of the fat peak 10 and the water peak 11 and a pre-determined frequency spacing 13 is displaced (shifted) relative to the spectrum 9 in order to calculate the cross-correlation coefficients. Based on the reference lines 14, it can be seen that the matching of the spectrum 9 to the model spectrum 12 is low. The comparison always only takes place within the limits 15. In order to calculate the closest cross-correlation coefficients, the model spectrum 12 and thus the limits 15 are displaced in the direction of the arrow 16.

At some point in time, the calculation of the cross-correlation coefficient takes place at the position shown in FIG. 3. In this case, the matching of the model spectrum 12 to the spectrum 9 is much better and therefore, the value of the calculated cross-correlation coefficient is very much higher than that according to FIG. 2. Since the model spectrum 12 shown matches the spectrum 9 with regard also to the frequency spacing 13 and the relative signal intensities, in the position according to FIG. 3, the model spectrum 12 supplies the highest cross-correlation coefficient. Thus, the resonance frequencies of fat and water protons can be determined, along with the transmission frequency for operating the magnetic resonance system 1.

Figure 4:
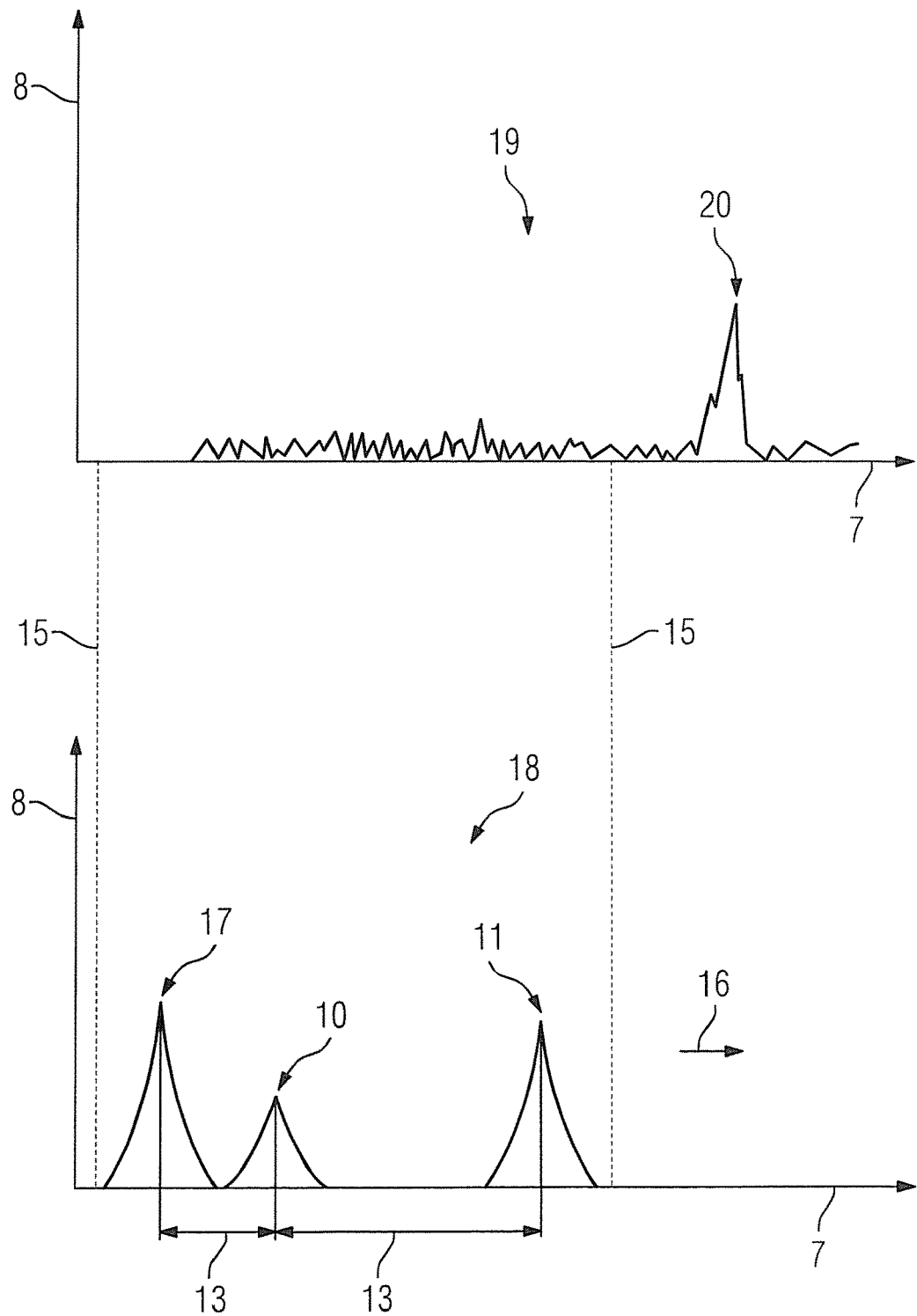
FIG. 4 shows a model spectrum in an embodiment according to the invention.

The procedure as described has the disadvantage that user interaction is required. According to the invention, the model spectra that are used have three resonance peaks, in particular a silicone peak 17, a fat peak 10 and a water peak 11, as FIG. 4 shows. If the peaks 10, 11 and 17 of the model spectrum 18 are displaced relative to the peaks 10 and 11 of the spectrum 19, a cross-correlation coefficient which has a very low value, results.

As previously described in relation to FIG. 2, the model spectrum 18 is also displaced relative to the spectrum 19. This takes place in that it is always a different segment of the spectrum 19, specifically the portion within the limits 15 that is used in order to determine a correlation coefficient of the spectrum 19 or its segment and the model spectrum 18.

When evaluating the cross-correlation coefficients, it is necessary to distinguish three cases:

If the spectrum 19 has only one peak, for example the water peak 20, all the cross-correlation coefficients have a low numerical value since always at least two peaks 10, 11 or 17 have no corresponding peak in the spectrum 19. However, at positions in the model spectrum 12 where one of the peaks 10, 11 or 17 have the same position as the water peak 20, a higher value of the correlation coefficient is to be expected. Even after the evaluation of a single model spectrum 12, in favorable cases, based on the cross-correlation coefficients it is already possible to state how many resonance peaks there are in the measured spectrum 19.

Figure 5:
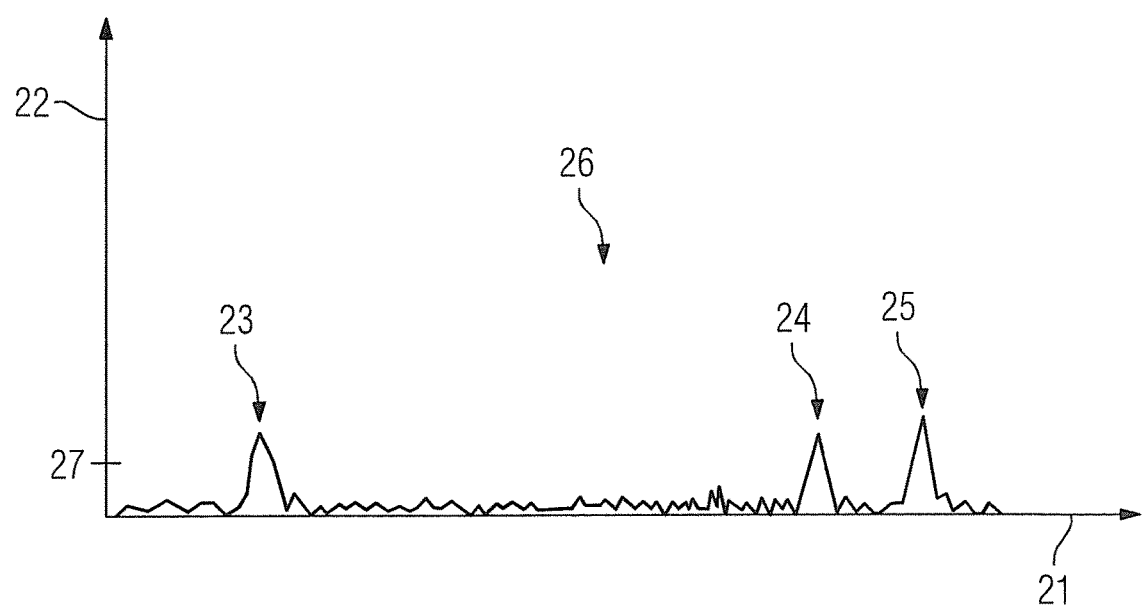
FIG. 5 shows a characteristic line in an embodiment according to the invention.

FIG. 5 shows a characteristic line of the cross-correlation coefficient for the model spectrum 13 and the spectrum 19. The axis 21 represents a measure of the relative position of the model spectrum 13 in relation to the spectrum 19, for example, the segment number or the like is entered here. The axis 22 represents the numerical value of the cross-correlation coefficient.

The peak 23 originates from the positional matching of the water peak 20 with the water peak 11, the peak 24 from the corresponding matching with the fat peak 10 and the peak 25 from the matching with the silicone peak 17. The spacings of the peaks 23 and 24 and of 24 and 25 are proportional to the spacings of the peaks 10, 11 and 17.

This effect can be amplified in that as the first model spectrum, a model spectrum is used in which the signal intensities of the resonance peaks have the same height. This is therefore a preferred development which can be present independently of other embodiments.

The peaks 23, 24 and 25 of the characteristic line 26 of the cross-correlation coefficients are therefore characteristic for the presence of a peak in the spectrum 19.

The characteristic line 26, however, is also a type of spectrum that can be more easily evaluated than the spectrum 19. For example, a threshold value 27 can be pre-determined and it is counted how often the characteristic line 26 rises above this threshold value 27 and falls below it again. If it rises thereabove three times, the spectrum 19 has a peak. The position of the peak can also be derived from the characteristic line 26. This concludes the determination of the resonance frequency.

If, with the first model spectrum, no cross-correlation coefficients can be found which are large enough, further model spectra with other line widths can be taken into account. The frequency spacings are immaterial if the spectrum 19 has only one resonance peak, specifically the water peak 20. The signal intensities are the same and the respective maximum values agree as described above. However, if only low-valued cross-correlation coefficients are produced, this can be due to excessively small or large line widths.

Figure 6:
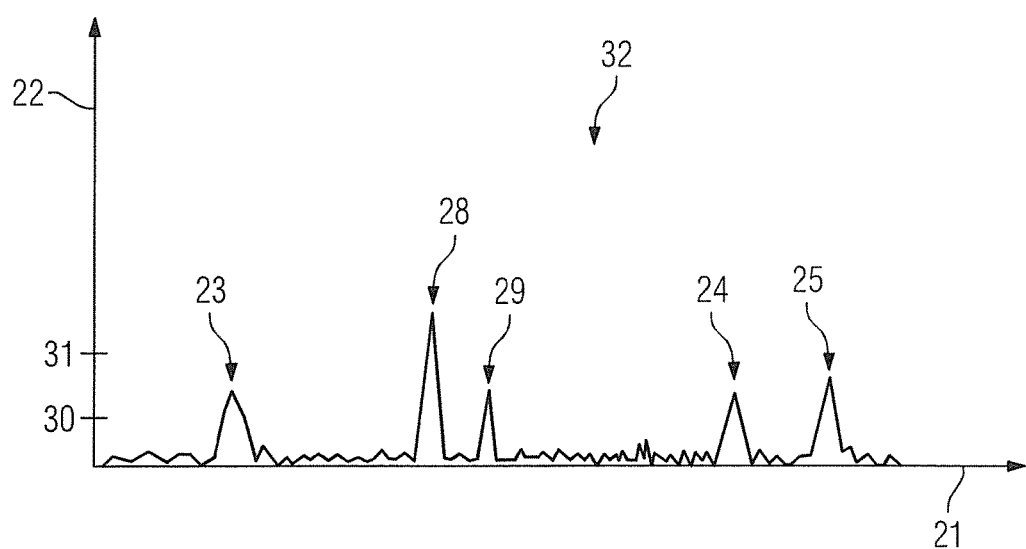
FIG. 6 shows a characteristic line in another embodiment according to the invention.

However, FIG. 6 shows a characteristic line 32 of the cross-correlation coefficients for the case that a spectrum 9 with two peaks is present, as in FIG. 2. Compared with the characteristic line 26, this has two further peaks 28 and 29. The characteristic line 32 is also characteristic for the presence of two peaks in the spectrum 9, that is, the respective analyzed spectrum. Based on one or two threshold values 30 and 31, the characteristic line 32 can also be analyzed as described above.

Based on the spacings of the peaks 23, 24, 25, 28 and 29, it can also be determined whether the spectrum 9 has a fat peak and a water peak or a silicone peak and a water peak or even a fat peak and a silicone peak.

Figure 7:
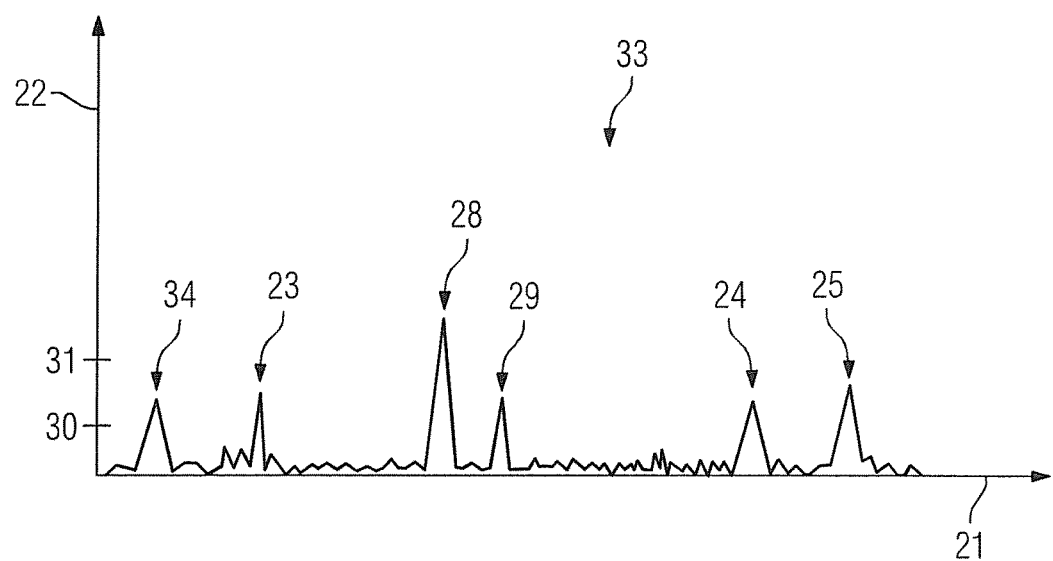
FIG. 7 shows a characteristic line in another embodiment according to the invention.

If, however, the measured spectrum has three peaks, a characteristic line 33 as per FIG. 7 is produced. This has 6 peaks 23, 24, 25, 28, 29 and 34. The third peak 28 has the largest value since, in this segment of the measured spectrum, all three peaks 10, 11 and 17 of the model spectrum each have a respective partner.

The other peaks 23, 24, 25, 29 and 34 are normally not equal in height, since the peaks of the measured spectrum have different signal intensities and therefore the cross-correlation coefficient is also different.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for automated determination of the resonance frequency or resonance frequencies of protons for a magnetic resonance examination of a subject, comprising:

before conducting said magnetic resonance examination, operating a magnetic resonance data acquisition unit to acquire at least one magnetic resonance signal from the subject, said at least one magnetic resonance signal comprising respective signal contributions from each of at least one spin species in the subject;

providing said at least one magnetic resonance signal to a computer and, in said computer, Fourier transforming said signal into a spectrum, said spectrum comprising a respective resonance peak for each of said spin species;

in said computer, automatically cross-correlating said spectrum with at least one model spectrum that comprises three resonance peaks, in order to obtain at least two cross-correlation coefficients from the spectrum provided to the computer and, from respective values of said cross-correlation coefficients, determining the resonance frequency or resonance frequencies; and providing said resonance frequency or resonance frequencies in electronic form from said computer to said magnetic resonance data acquisition unit in order to operate said magnetic resonance data acquisition unit at said resonance frequency or resonance frequencies in said magnetic resonance examination.

2. A method as claimed in claim 1 comprising employing, as said model spectrum, a model spectrum comprising frequency spacings of said resonance peaks that correspond to the frequency spacings of water protons from fat protons and water protons from silicone protons.

3. A method as claimed in claim 1 comprising employing a plurality of model spectra respectively having frequency spacings between said resonance peaks that are different from spectrum-to-spectrum.

4. A method as claimed in claim 3 wherein said frequency spacings increase from spectrum-to-spectrum.

5. A method as claimed in claim 3 wherein said frequency spacings decrease from spectrum-to-spectrum.

6. A method as claimed in claim 1 comprising employing a plurality of model spectra respectively comprising relative signal intensities of said resonance peaks that differ from spectrum-to-spectrum.

7. A method as claimed in claim 1 comprising employing a plurality of model spectra having respectively different line widths of the resonance peaks therein.

8. A method as claimed in claim 1 comprising terminating calculation of said at least two cross-correlation coefficients when a predetermined threshold value is exceeded.

9. A method as claimed in claim 8 comprising employing a plurality of model spectra respectively comprising parameters that change in larger steps than is required for a predetermined quality.

10. A method as claimed in claim 1 comprising employing a plurality of model spectra, including a first model spectrum, and selecting a spectrum as set first model spectrum wherein respective signal intensities of the resonance peaks thereof are substantially equal.

11. A method as claimed in claim 1 comprising, from at least some of said cross-correlation coefficient, determining at least one characteristic line from which data concerning said spectrum are obtained.

12. A method as claimed in claim 1 comprising determining said resonance frequency as a starting frequency for a renewed determination of said resonance frequency or resonance frequencies.

13. A method as claimed in claim 1 comprising operating said magnetic resonance data acquisition unit to acquire said at least one magnetic resonance signal as an FID signal.

14. A magnetic resonance apparatus comprising:

a magnetic resonance data acquisition unit;

a control computer configured to operate the magnetic resonance data acquisition unit, before conducting said magnetic resonance examination, while an examination subject is situated therein, to acquire at least one magnetic resonance signal from the subject, said at least one magnetic resonance signal comprising respective signal contributions from each of at least one spin species in the subject;

a processing computer provided with said at least one magnetic resonance signal, said processing computer being configured to Fourier transform said signal into a spectrum, said spectrum comprising a respective resonance peak for each of said spin species;

said processing computer being configured to automatically cross-correlate said spectrum with at least one model spectrum that comprises three resonance peaks, in order to obtain at least two cross-correlation coefficients and, from respective values of said cross-correlation coefficients, to determine the resonance frequency or resonance frequencies; and said processing computer being configured to provide said resonance frequency or resonance frequencies to said control computer in electronic form and said control computer being configured to operate said magnetic resonance data acquisition unit at said resonance frequency or resonance frequencies in said magnetic resonance examination.

* * * * *